United States Patent
Ting et al.

(10) Patent No.: US 11,424,385 B2
(45) Date of Patent: Aug. 23, 2022

(54) MICRO LIGHT-EMITTING ELEMENT AND DEVICE AND TRANSFER METHOD THEREOF

(71) Applicant: XIAMEN SANAN OPTOELECTRONICS CO., LTD., Xiamen (CN)

(72) Inventors: Shao-ying Ting, Xiamen (CN); Junfeng Fan, Xiamen (CN); Chia-en Lee, Xiamen (CN); Chen-ke Hsu, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 154 days.

(21) Appl. No.: 17/024,391

(22) Filed: Sep. 17, 2020

(65) Prior Publication Data

US 2021/0005782 A1    Jan. 7, 2021

Related U.S. Application Data

(63) Continuation-in-part of application No. PCT/CN2018/085133, filed on Apr. 28, 2018.

(30) Foreign Application Priority Data

Mar. 20, 2018  (CN) .......................... 201810229801.3

(51) Int. Cl.
*H01L 33/22*    (2010.01)
*H01L 27/15*    (2006.01)
(Continued)

(52) U.S. Cl.
CPC ............ *H01L 33/22* (2013.01); *H01L 27/156* (2013.01); *H01L 33/005* (2013.01); *H01L 33/502* (2013.01); *H01L 33/62* (2013.01)

(58) Field of Classification Search
CPC ..... H01L 33/22; H01L 27/156; H01L 33/005; H01L 33/502; H01L 33/62; H01L 25/0753; H01L 33/20; H01L 33/0095
See application file for complete search history.

(56) References Cited

U.S. PATENT DOCUMENTS

| | | | | |
|---|---|---|---|---|
| 10,008,465 | B2 * | 6/2018 | Bower | H05K 3/20 |
| 2015/0028362 | A1 * | 1/2015 | Chan | H01L 24/29 |
| | | | | 438/28 |

(Continued)

FOREIGN PATENT DOCUMENTS

| | | |
|---|---|---|
| CN | 106847796 A | 6/2017 |
| CN | 107078094 A | 8/2017 |

OTHER PUBLICATIONS

Search Report issued to PCT application No. PCT/CN2018/085133 by the WIPO dated Dec. 26, 2018.

(Continued)

*Primary Examiner* — Victor A Mandala
(74) *Attorney, Agent, or Firm* — Thomas|Horstemeyer, LLP

(57) ABSTRACT

A micro light-emitting device includes a support structure with a cavity and at least one micro light-emitting element that includes a semiconductor structure accommodated by the cavity, at least one bridge connection member disposed on the semiconductor structure to interconnect the semiconductor structure and the support structure, and a protruding contact member disposed on at least one of the semiconductor structure and the bridge connection member and protruding therefrom to be configured to contact with a transfer means. The device is configured to contact with the transfer means at the protruding contact member of the element. A transfer method using the device is also disclosed.

37 Claims, 16 Drawing Sheets

(51) Int. Cl.
*H01L 33/00* (2010.01)
*H01L 33/50* (2010.01)
*H01L 33/62* (2010.01)

(56) References Cited

U.S. PATENT DOCUMENTS

| | | | |
|---|---|---|---|
| 2015/0348926 A1 | 12/2015 | Bower | |
| 2016/0336488 A1* | 11/2016 | Bower | H01L 33/007 |
| 2017/0122502 A1 | 5/2017 | Cok et al. | |
| 2017/0133550 A1* | 5/2017 | Schuele | H01L 25/167 |
| 2017/0345692 A1* | 11/2017 | Liu | H01L 25/167 |
| 2018/0323178 A1* | 11/2018 | Meitl | H01L 25/0753 |
| 2019/0319015 A1* | 10/2019 | Schuele | H01L 25/0753 |
| 2019/0319163 A1* | 10/2019 | Schuele | H01L 33/0095 |
| 2020/0303595 A1* | 9/2020 | Wu | H01L 33/38 |
| 2020/0313056 A1* | 10/2020 | Hong | H01L 25/0753 |
| 2021/0091052 A1* | 3/2021 | Schuele | H01L 33/0095 |

OTHER PUBLICATIONS

Search Report appended to an Office Action, which was issued to Taiwanese counterpart application No. 108107566 by the TIPO dated Dec. 27, 2019 with an English translation thereof.
Search Report appended to an Office Action, which was issued to Chinese counterpart application No. 201810229801.3 by the CNIPA dated Apr. 2, 2020 with an English translation thereof.

* cited by examiner

MICRO LIGHT-EMITTING ELEMENT AND DEVICE AND TRANSFER METHOD THEREOF

CROSS-REFERENCE TO RELATED APPLICATION

This application is a bypass continuation-in-part application of International Application No. PCT/CN2018/085133 filed on Apr. 28, 2018, which claims priority of Chinese Patent Application No. 201810229801.3, filed on Mar. 20, 2018. The entire content of each of the international and Chinese patent applications is incorporated herein by reference.

FIELD

The disclosure relates to light-emitting elements and devices and transfer methods thereof, and more particularly to micro light-emitting elements and devices and transfer methods thereof.

BACKGROUND

Micro light emitting diodes (microLEDs) are a next generation light source for display devices, being the focus of research and development in the industry. MicroLEDs have advantages such as low power/energy consumption, high luminance, high resolution, high color saturation, fast response speed, and long service life. Furthermore, the power consumption of microLED display devices is only about 10% of that of LCD (liquid-crystal display) devices, or is only 50% of that of OLED (organic light-emitting diode) display devices. In addition, compared to OLED display devices which, like microLED display devices, are self-emissive, microLED display devices have luminance that is 30 times higher, and resolution that is up to 1500 PPI (pixels per inch). Based on the aforesaid advantages of microLED display devices, it is expected that microLED display devices will replace LCD devices and OLED display devices to be next generation display devices. However, mass production of microLEDs is still infeasible due to numerous technical issues, an important one of which is the unsatisfactory success rate of transfer.

A conventional transfer printing method for micro light-emitting elements (such as microLEDs) employs a transfer stamp to transfer a plurality of spaced apart micro light-emitting elements placed on a substrate. Specifically, the transfer stamp has a plurality of spaced apart stamp protrusions that protrude from a surface of the transfer stamp facing the micro light-emitting elements. Therefore, transfer of the micro light-emitting elements from the substrate to a desired destination can be achieved by such transfer stamp. However, due to the micro size of the micro light-emitting elements, the stamp protrusions of the transfer stamp must be precisely dimensioned (hence raising the bar for the production of the transfer stamp), or the micro light-emitting elements must be correctly picked up by the stamp protrusions of the transfer stamp through precise positioning (hence rendering the transfer method inconvenient).

Referring to FIG. 1, a transfer stamp 200 is used for transfer printing of a conventional microLED 110. Specifically, the microLED 110 is connected to a support structure 130 to be supported thereby and cooperate therewith for forming a transferable device. The support structure 130 includes a substrate 131 and a bonding layer 132 that is disposed on the substrate 131, and that defines an open cavity 120 therein for accommodating the microLED 110. The microLED 110 includes an epitaxial semiconductor structure 113, a first electrode 111 and a second electrode 112 that are disposed on the epitaxial semiconductor structure 113, and a bridge member 140 that is disposed on the epitaxial semiconductor structure 133 opposite to the first and second electrodes 111, 112, and that interconnects the epitaxial semiconductor structure 113 and the bonding layer 132 of the support structure 130 for the bonding layer 132 to support the microLED 110. During the transfer printing, a force applied to the transfer stamp 200 might undesirably damage or break the bridge member 140 (see the portion thereof encircled by the broken line in FIG. 1), causing the microLED 110 to fall into the open cavity 120 of the bonding layer 132 and hence reducing the success rate of transfer.

SUMMARY

Therefore, an object ox the disclosure is to provide a micro light-emitting element, a micro light-emitting device, and a method for transferring a micro light-emitting element which can alleviate at least one of the drawbacks of the prior art.

The micro light-emitting element is adapted to be supported by a support structure, and is adapted to contact with and be transferred by a transfer means from the support structure. The support structure has an open cavity. The micro light-emitting element includes an epitaxial semiconductor structure, at least one bridge connection member, and a protruding contact member. The epitaxial semiconductor structure is configured to be accommodated by the open cavity of the support structure. The bridge connection member is disposed on the epitaxial, semiconductor structure to be configured to interconnect the epitaxial semiconductor structure and the support structure for the support structure to support the micro light-emitting element. The protruding contact member is disposed on at least one of the epitaxial semiconductor structure and the bridge connection member, and protrudes therefrom to be configured to contact with the transfer means. The protruding contact member extends away from the epitaxial semiconductor structure to terminate at an end that is farther away from the epitaxial semiconductor structure than the bridge connection member, so that the micro light-emitting element is configured to contact with the transfer means at the protruding contact member.

The micro light-emitting device is adapted to contact with a transfer means, and includes a support structure and at least one micro light-emitting element as described above. The support structure has an open cavity. An epitaxial semiconductor structure of the micro light-emitting element is accommodated by the open cavity of the support structure. The micro light-emitting element has at least one bridge connection member that is disposed on the epitaxial semiconductor structure to interconnect the epitaxial semiconductor structure and the support structure for the support structure to support the micro light-emitting element. A protruding contact member of the micro light-emitting element is disposed on at least one of the epitaxial semiconductor structure and the bridge connection member, and protrudes therefrom to be configured to contact with the transfer means. The protruding contact member extends away from the epitaxial semiconductor structure to terminate at an end that is farther away from the epitaxial semiconductor structure than the bridge connection member, so that the micro light-emitting device is configured to contact with the transfer means at the protruding contact member of the micro light-emitting element, and so that the micro light-emitting element is configured to foe transferred by the transfer means from the support structure.

The transfer method includes the following steps. A micro light-emitting device as described above and a transfer means are provided. The micro light-emitting device has at least one micro light-emitting element. The transfer means is brought into contact with a protruding contact member of the micro light-emitting element of the micro light-emitting device. A force is applied to the protruding contact member of the micro light-emitting element of the micro light-emitting device via the transfer means, so as to separate the micro light-emitting element of the micro light-emitting device from a support structure of the micro light-emitting device for the transfer means to transfer the micro light-emitting element.

Another object of the disclosure is to provide another micro light-emitting element which can alleviate at least one of the drawbacks of the prior art.

The another micro light-emitting element is obtained using the aforesaid method.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
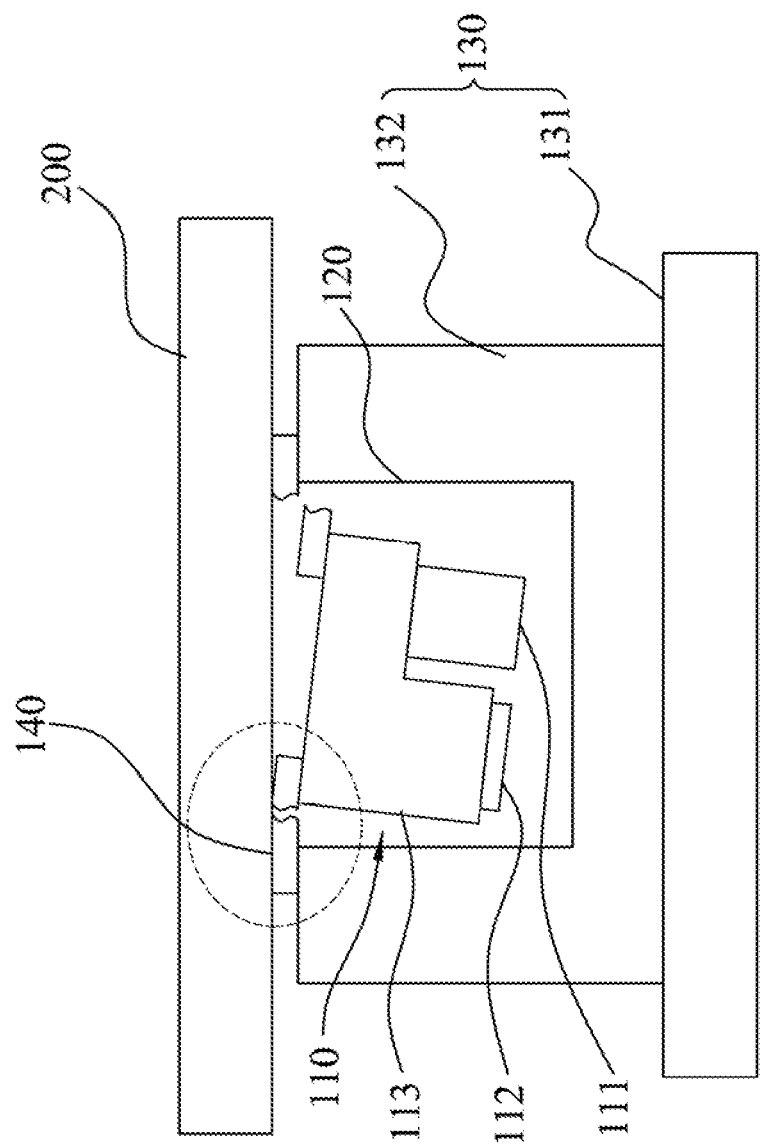
FIG. 1 is a schematic sectional view illustrating that a conventional micro light-emitting element is transferred by a transfer stamp.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
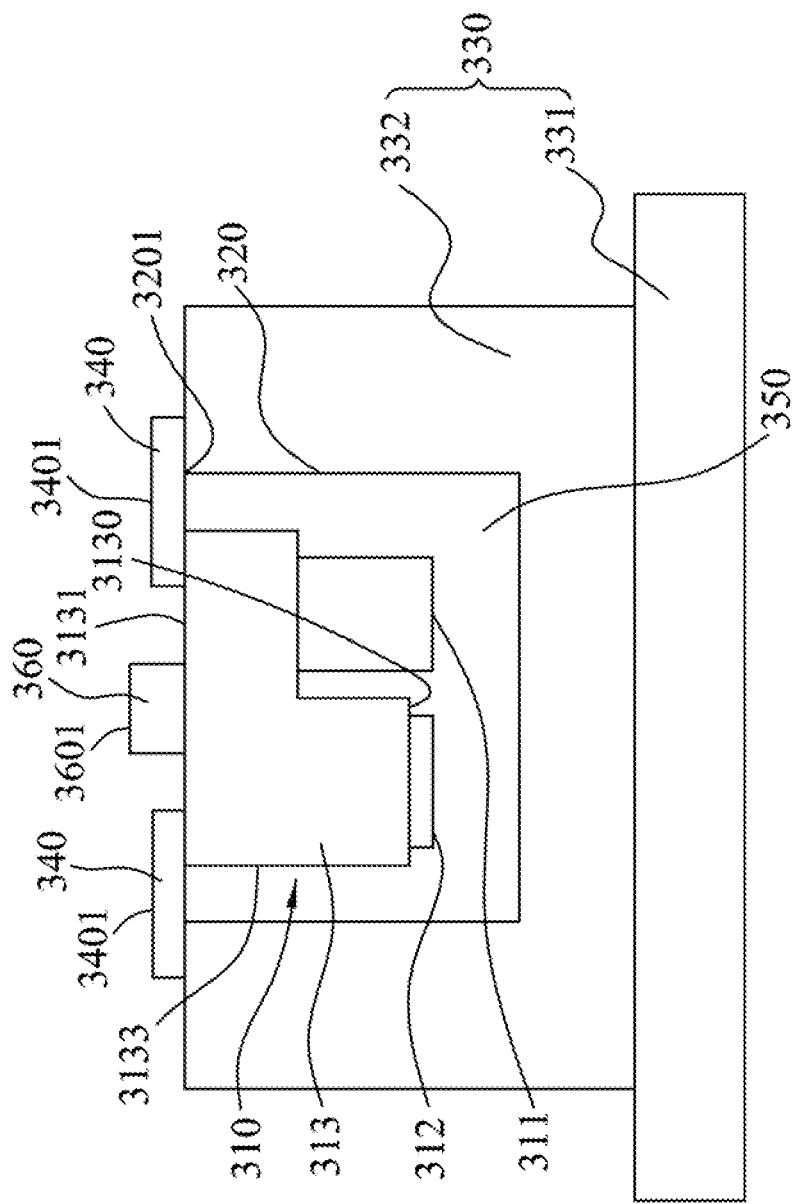
FIG. 2 is a schematic sectional view illustrating a first embodiment of a micro light-emitting device according to the present disclosure.
Figure 3:
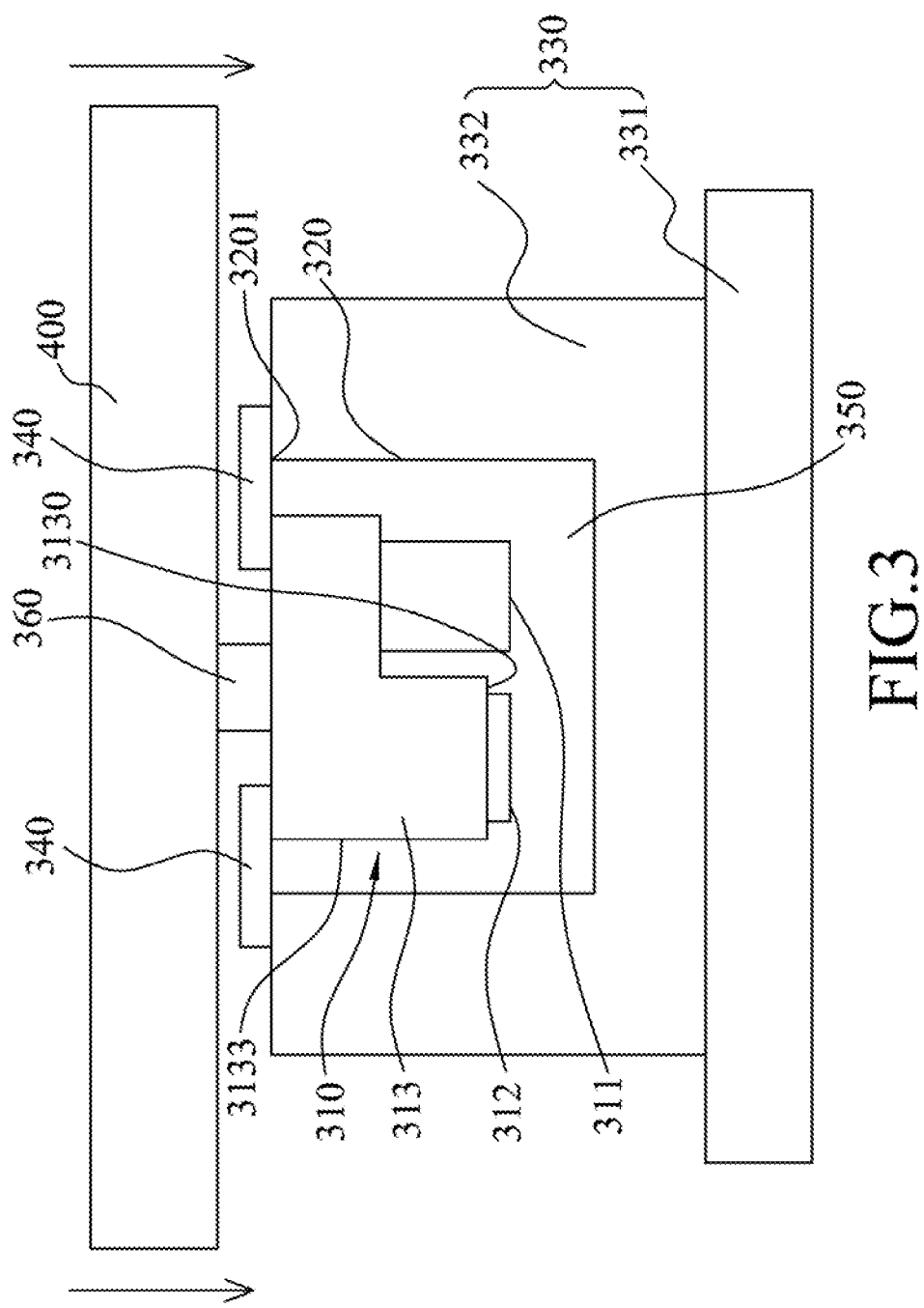
FIG. 3 is a schematic sectional view illustrating that a micro light-emitting element in the first embodiment of the micro light-emitting device is transferred using a transfer stamp.

Referring to FIG. 2, a first embodiment of a micro light-emitting device according to the present disclosure is adapted to contact with a transfer means (for instance, a transfer stamp 400 as shown in FIG. 3), and includes a support structure 330 and a micro light-emitting element 310 (which may be, for instance, a micro light-emitting diode). The support structure 330 has an open cavity 320 that has an opening 3201. The micro light-emitting element 310 includes an epitaxial semiconductor structure 313 that is accommodated by the open cavity 320 of the support structure 330, two bridge connection members 340 that are each disposed on the epitaxial semiconductor structure 313 to interconnect the epitaxial semiconductor structure 313 and the support structure 330 for the support structure 330 to support the micro light-emitting element 310, and a protruding contact member 360 that is disposed on the epitaxial semiconductor structure 313, and that protrudes from the epitaxial semiconductor structure 313 to be configured to contact with the transfer means. The protruding contact member 360 extends away from the epitaxial semiconductor structure 313 to terminate at an end that is farther away from the epitaxial semiconductor structure 313 than the bridge connection members 340, so that the micro light-emitting element 310 is configured to contact with the transfer means only at the protruding contact member 360 (see, for example, FIG. 3), and so that the micro light-emitting element 310 is configured to be transferred by the transfer means from the support structure 330.

The epitaxial semiconductor structure 313 of the micro light-emitting element 310 may include an n-type semiconductor layer, a multi-quantum well layer (i.e. a light-emitting active layer), and a p-type semiconductor layer. The epitaxial semiconductor structure 313 of the micro light-emitting element 310 may further include a functional layer such as a buffer layer, a barrier layer, a current spreading layer, a strain tuning layer, etc.

The micro light-emitting element 310 may have a length, a width, and a height that are in a range selected from the group consisting of 2 μm to 5 μm, 5 μm to 10 μm, 10 μm to 20 μm, 20 μm to 50 μm, and 50 μm to 100 μm.

In this embodiment, the micro light-emitting element 310 further includes a first electrode 311 and a second electrode 312. The epitaxial semiconductor structure 313 of the micro light-emitting element 310 has an upper semiconductor surface 3131 that faces away from the open cavity 320 of the support structure 330, a stepped lower semiconductor surface 3130 that is opposite to the upper semiconductor surface 3131, and a lateral semiconductor surface 3133 that is interposed between and interconnects the upper semiconductor surface 3131 and the stepped lower semiconductor surface 3130. The first, and second electrodes 311, 312 are disposed on the stepped lower semiconductor surface 3130 of the epitaxial semiconductor structure 313 and are spaced apart from each other. Since the micro light-emitting element 310 is a flip-chip light-emitting element in this embodiment, such element has advantageous luminance and can be directly subjected to packaging and bonding after transfer (hence facilitating subsequent processing).

It should be noted that the number of the bridge connection members 340 is not limited to two, and may be more than two (such as three, four, and so forth). Alternatively, only one bridge connection member 340 may be provided.

The bridge connection members 340 may be made from a material selected from the group consisting of a dielectric material, a metallic material, a semiconductor material, and combinations thereof.

In this embodiment, the support structure 330 includes a substrate 331 and a bonding layer 332 that is disposed on the substrate 331, and that defines the open cavity 320. The bridge connection members 340 are each disposed on the upper semiconductor surface 3131 of the epitaxial semiconductor structure 313 to interconnect the upper semiconductor surface 3131 of the epitaxial semiconductor structure 313 and the bonding layer 332 of the support structure 330.

The bonding layer 332 may be made from a material selected from the group consisting of a benzocyclobutene (BCB) adhesive, silicon rubber, an ultraviolet curable adhesive, a resin, and combinations thereof.

In this embodiment, the protruding contact member 360 is disposed between the bridge connection members 340 and on the upper semiconductor surface 3131 of the epitaxial semiconductor structure 313. The protruding contact member 360 is disposed outwardly of the open cavity 320 of the bonding layer 332, and is disposed farther away from the open cavity 320 of the bonding layer 332 compared to the epitaxial semiconductor structure 313.

The protruding contact member 360 may have a height larger than that of the bridge connection members 340. The protruding contact member 360 has an upper contact surface 3601 that faces away from the open cavity 320 of the bonding layer 332, and each of the bridge connection members 340 has an upper bridge surface 3401 that faces away from the open cavity 320 of the bonding layer 332. In this embodiment, on the upper semiconductor surface 3131 of the epitaxial semiconductor structure 313, the upper contact surface 3601 of the protruding contact member 360 is higher than the upper bridge surface 3401 of the bridge connection members 340. The protruding contact member 360 may have a height in a range selected from the group consisting of 0.5 μm to 1 μm, 1 μm to 3 μm, and 3 μm to 5 μm.

The protruding contact member 360 may be made from a transparent insulation material such as silicon dioxide or silicon nitride.

Alternatively, the protruding contact member 360 may be made from silicon rubber, a resin, an ultraviolet curable adhesive, or titanium dioxide ($TiO_2$). For example, in order to form the protruding contact member 360, silicon rubber, a resin, or an ultraviolet curable adhesive may be blended into a wavelength conversion material (e.g. phosphor powder), or a reflective material (e.g. titanium dioxide) may be employed to change the light path. The protruding contact member 360 can be made from a wavelength conversion material to satisfy the need of a display device in terms of color.

Still alternatively, the protruding contact member 360 may be made from an epitaxial semiconductor material selected from the group consisting of an n-type semiconductor material, a light-emitting active material of multiquantum wells, a p-type semiconductor material, silicon dioxide, silicon nitride, and combinations thereof.

The protruding contact member 360 may be in a form selected from the group consisting of a rectangular mesa, a barrel, a circular mesa, a cylinder, and a cone.

Referring to FIG. 3, the micro light-emitting element 310 may be separated from the support structure 330 and hence transferred using the transfer stamp 400. The transfer stamp 400 may be made from a material selected from the group consisting of polydimethylsiloxane (PDMS), silicon rubber, a thermal release tape, an ultraviolet curable adhesive, and combinations thereof.

It should be noted that any suitable transfer means other than the transfer stamp 400 may be applied. Since suitable transfer means are well-known and commonly used in the art, the details thereof are omitted herein for the sake of brevity.

Referring back to FIG. 2, the micro light-emitting device may further include a sacrificial layer 350 that is disposed in the open cavity 320 of the bonding layer 332 and between the bonding layer 332 and the epitaxial semiconductor structure 313 of the micro light-emitting element 310 (in this embodiment, the sacrificial layer 350 is also disposed between the bonding layer 332 and first electrode 311 and between the bonding layer 332 and the second electrode 312). The sacrificial layer 350 can be removed in a manner that does not undesirably damage the micro light-emitting element 310. Such manner may be a chemical or physical, manner, for instance, ultraviolet light radiation, etching, impingement, and so forth.

Figure 4:
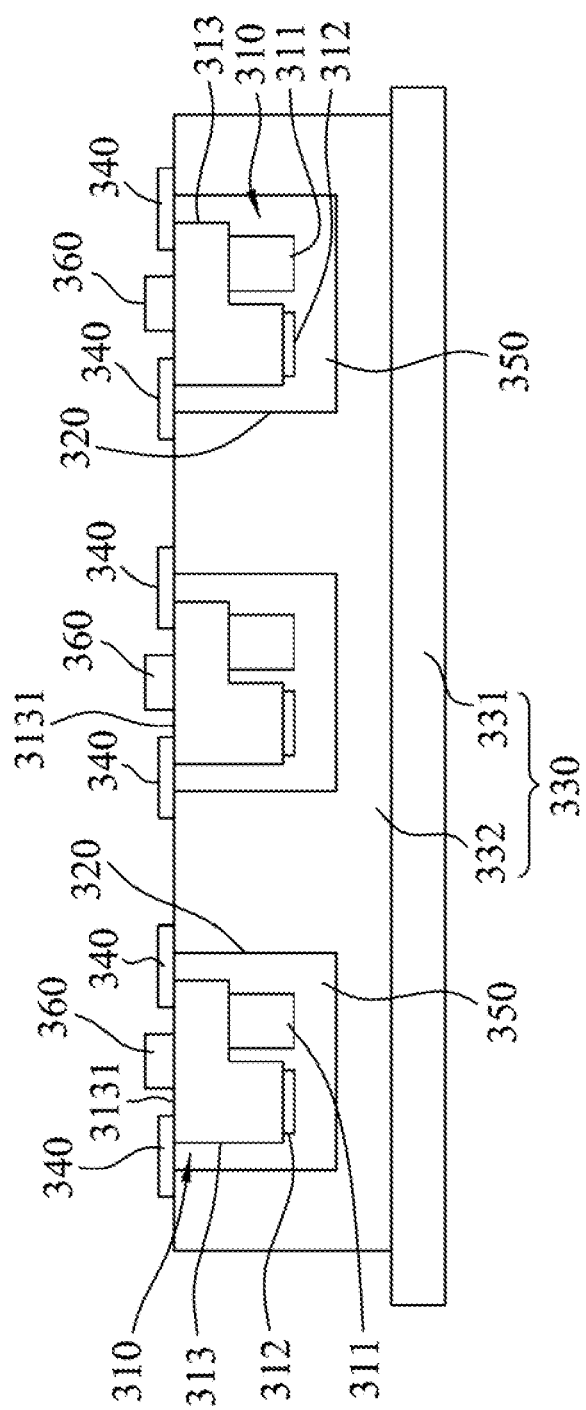
FIG. 4 is a schematic sectional view illustrating a variation of the first, embodiment of the micro light-emitting device.

Referring to FIG. 4, in a variation of the first embodiment, the micro light-emitting device includes a plurality of the micro light-emitting elements 310. The bonding layer 332 of the support structure 330 has a plurality of the open cavities 320 for respectively accommodating the epitaxial semiconductor structures 313 and the first and second electrodes 311, 312 of the micro light-emitting elements 310. The micro light-emitting elements 310 may be arranged, for example, in a matrix array.

Figure 5:
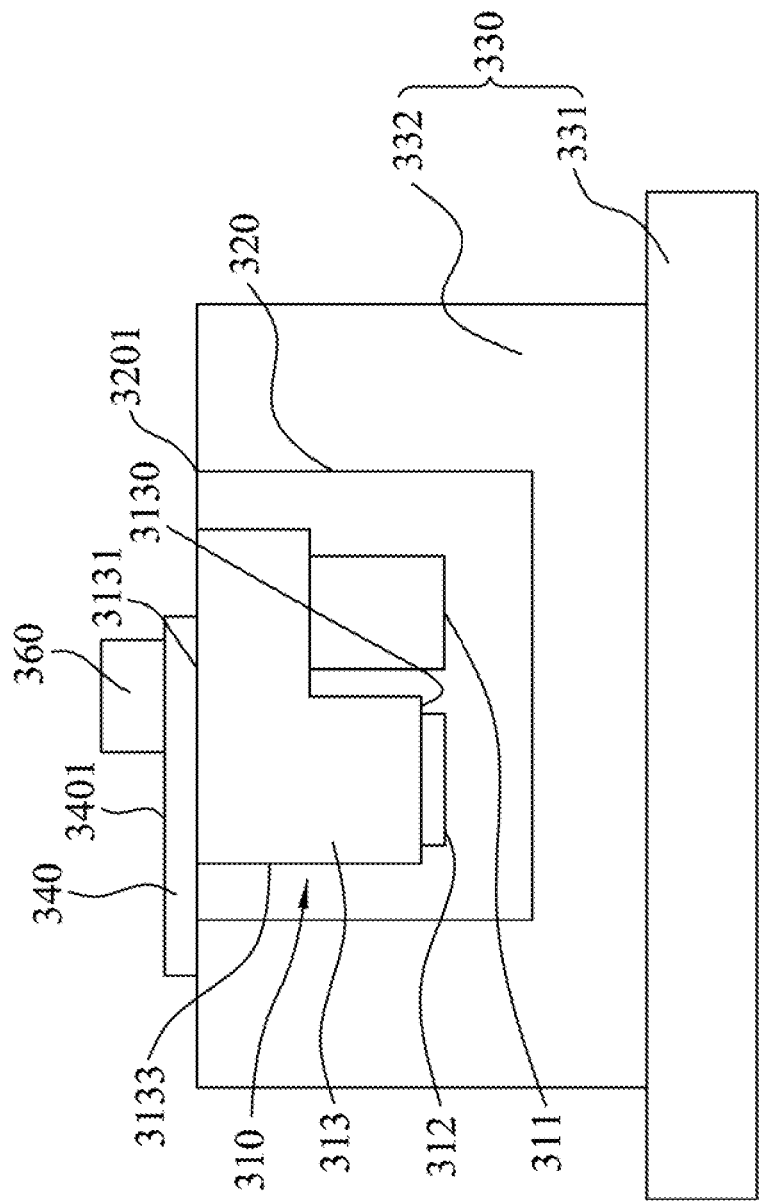
FIG. 5 is a schematic sectional view illustrating a second embodiment of the micro light-emitting device according to the present disclosure.

Referring to FIG. 5, a second embodiment of the micro light-emitting device according to the present disclosure is generally similar to the first embodiment, except for the following differences.

The micro light-emitting element 310 has only one bridge connection member 340, and the protruding contact member 360 is disposed on the upper bridge surface 3401 of the bridge connection member 340.

The protruding contact member 360 may be made from a material the same as at least one material of the epitaxial semiconductor structure 313.

Figure 6:
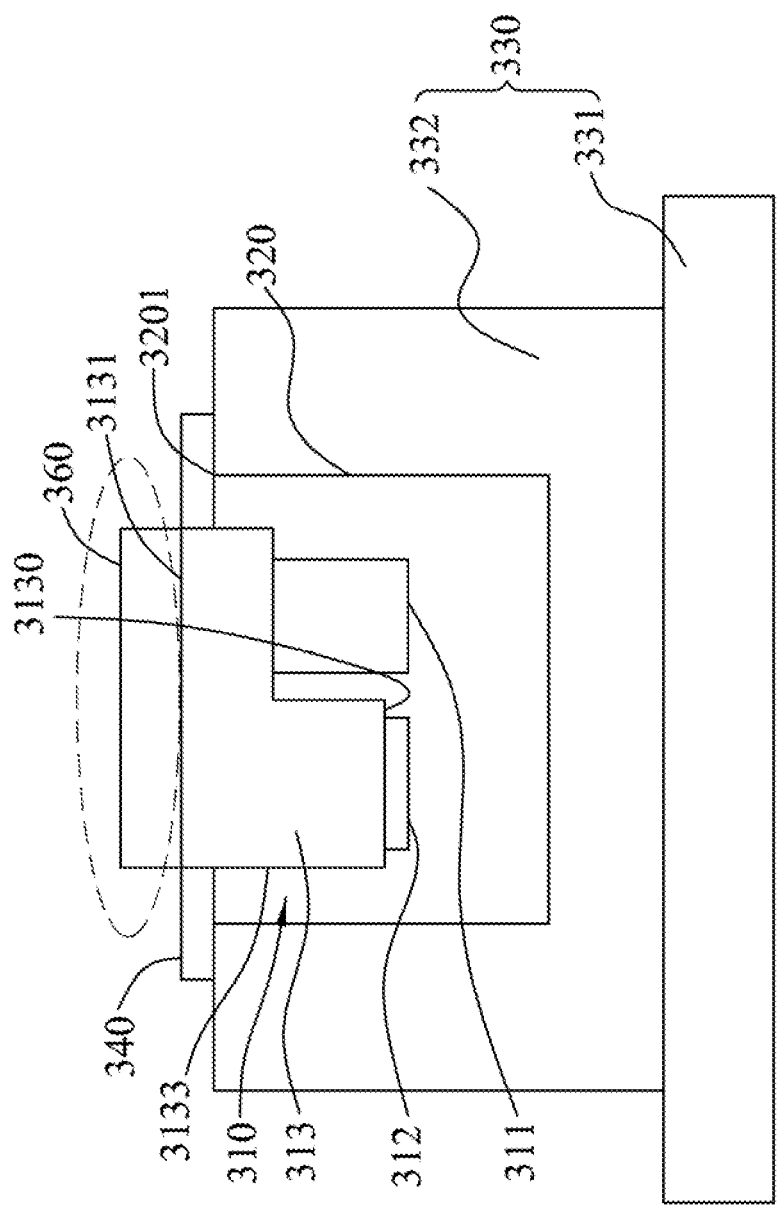
FIG. 6 is a schematic sectional view illustrating a third embodiment of the micro light-emitting device according to the present disclosure.

Referring to FIG. 6, a third embodiment of the micro light-emitting device according to the present disclosure is generally similar to the first embodiment, except for the following differences.

Each of the bridge connection members 340 interconnects the lateral semiconductor surface 3133 of the epitaxial semiconductor structure 313 and the bonding layer 332 of the support structure 330, such that the bridge connection members 340 form a flange. The protruding contact member 360 is disposed on the upper semiconductor surface 3131 of the epitaxial semiconductor structure 313, and is disposed farther away from the open cavity 320 of the bonding layer 332 compared to the bridge connection members 340 and the epitaxial semiconductor structure 313.

The bridge connection members 340 in the flange form may be made from an n-type semiconductor material or a p-type semiconductor material. It should be noted that the epitaxial semiconductor structure 313, the bridge connection members 340, and the protruding contact member 360 may be separate components that can be assembled together, or may be formed as a single piece.

Figure 7:
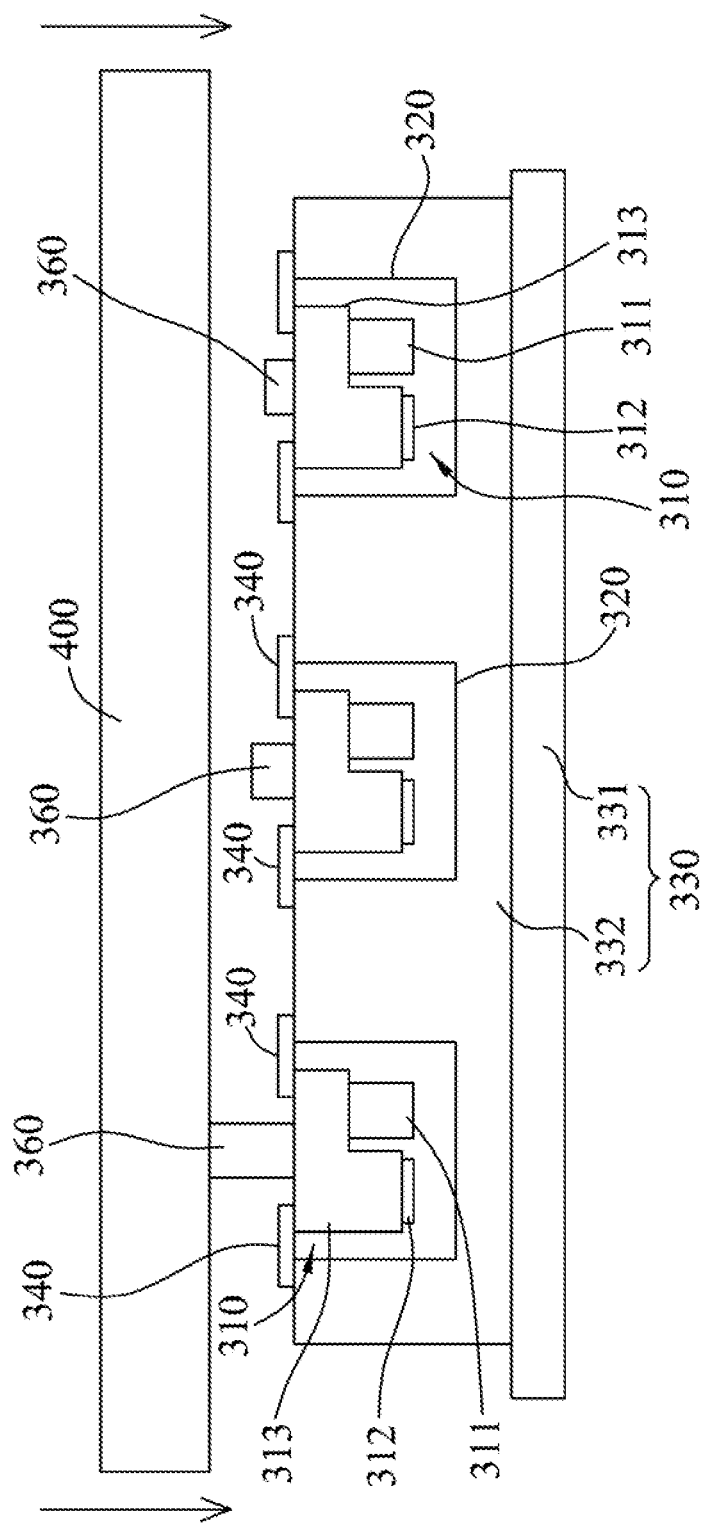
FIG. 7 is a schematic sectional view illustrating that the micro light-emitting elements in a fourth embodiment of the micro light-emitting device according to the present disclosure are selectively transferred using the transfer stamp.

Referring to FIG. 7, a fourth embodiment of the micro light-emitting device according to the present disclosure is generally similar to the variation of the first embodiment shown in FIG. 4, except that the protruding contact members 360 are different in height, and that the epitaxial semiconductor structures 313, the first electrodes 311, and/or the second electrodes 312 under the protruding contact members 360 are different in a property such as size, shape, emission wavelength, luminance, or color temperature.

Figure 15:
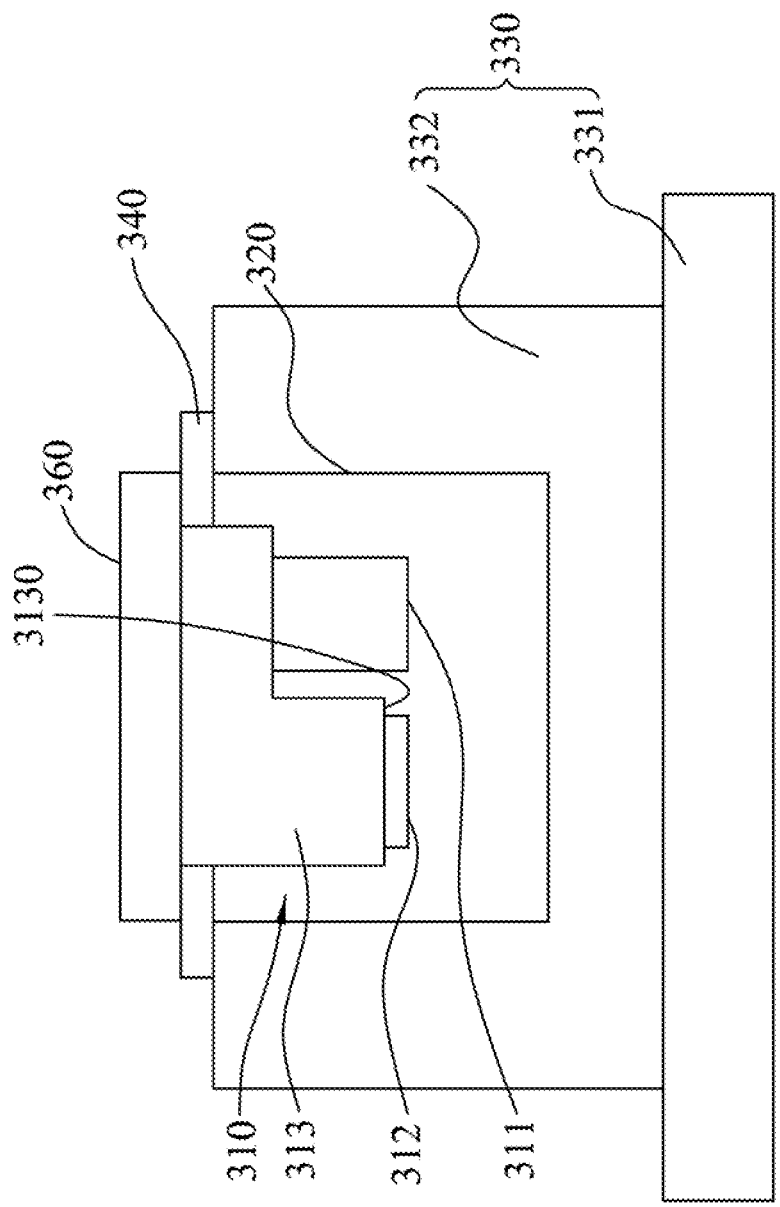
FIG. 15 is a schematic sectional view illustrating a fifth embodiment of the micro light-emitting device according to the present disclosure.

Referring to FIG. 15, a fifth embodiment of the micro light-emitting device according to the present disclosure is generally similar to the third embodiment, except that the protruding contact member 360 is disposed on the upper semiconductor surface 3131 of the epitaxial semiconductor structure 313 and the upper bridge surfaces 3401 of the bridge connection members 340.

Figure 16:
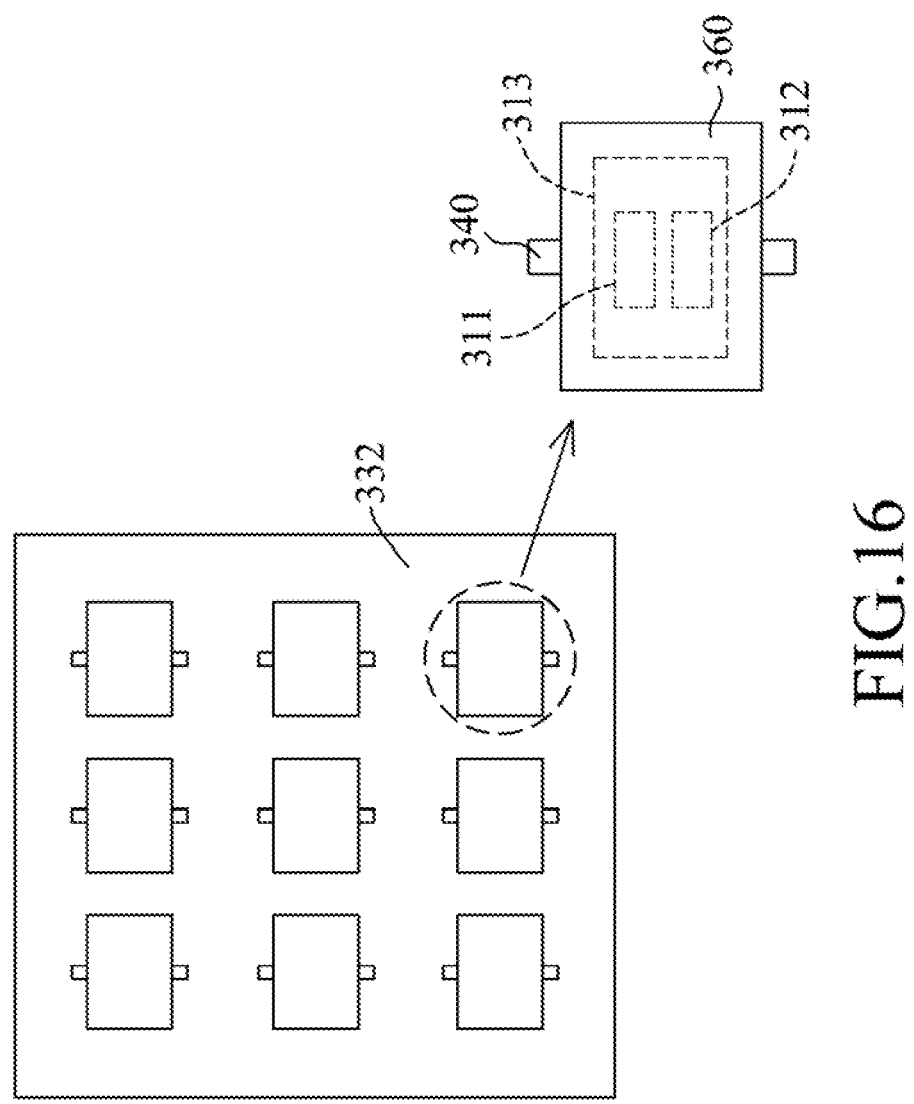
FIG. 16 is a schematic top view illustrating a variation of the fifth embodiment of the micro light-emitting device.

Referring to FIG. 16, in a variation of the fifth embodiment of the micro light-emitting device, an array of the micro light-emitting elements 310 are provided on the support structure 330. Specifically, the bonding layer 332 of the support structure 330 has a plurality of the open cavities 320 for respectively accommodating the epitaxial semiconductor structures 313 and the first and second electrodes 311, 312 of the micro light-emitting elements 310. After transfer by the transfer means, such array of the micro light-emitting elements 310 can be disposed on a circuit board of a display device (not shown).

Figure 8:
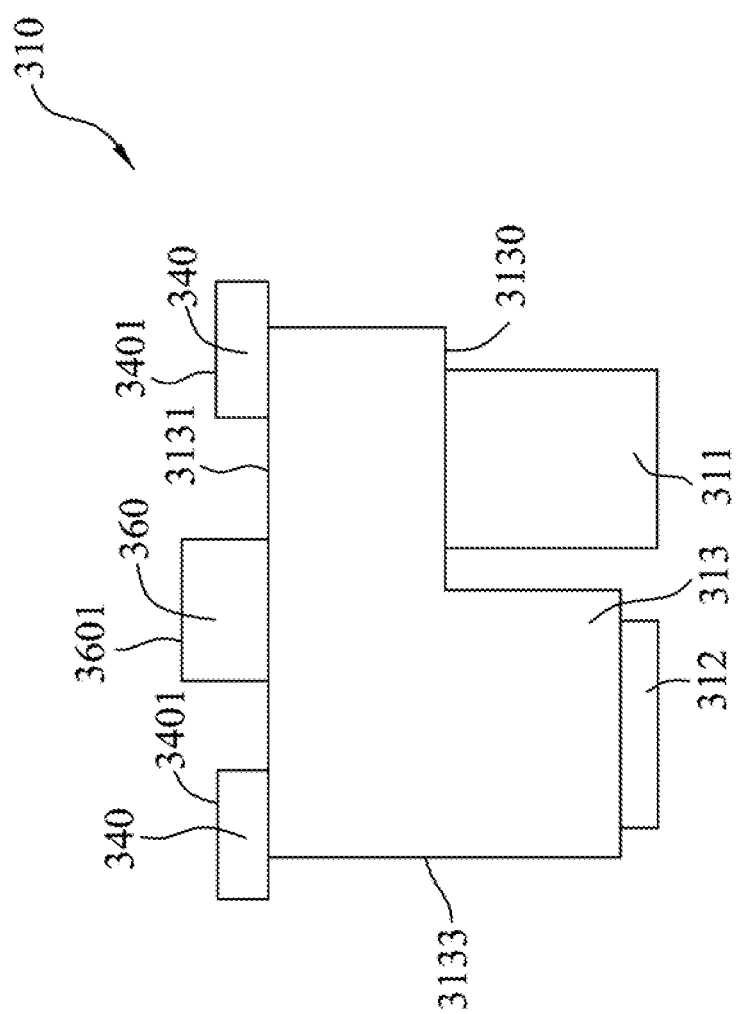
FIG. 8 is a schematic sectional view illustrating the micro light-emitting element separated from the first embodiment of the micro light-emitting device.
Figure 12:
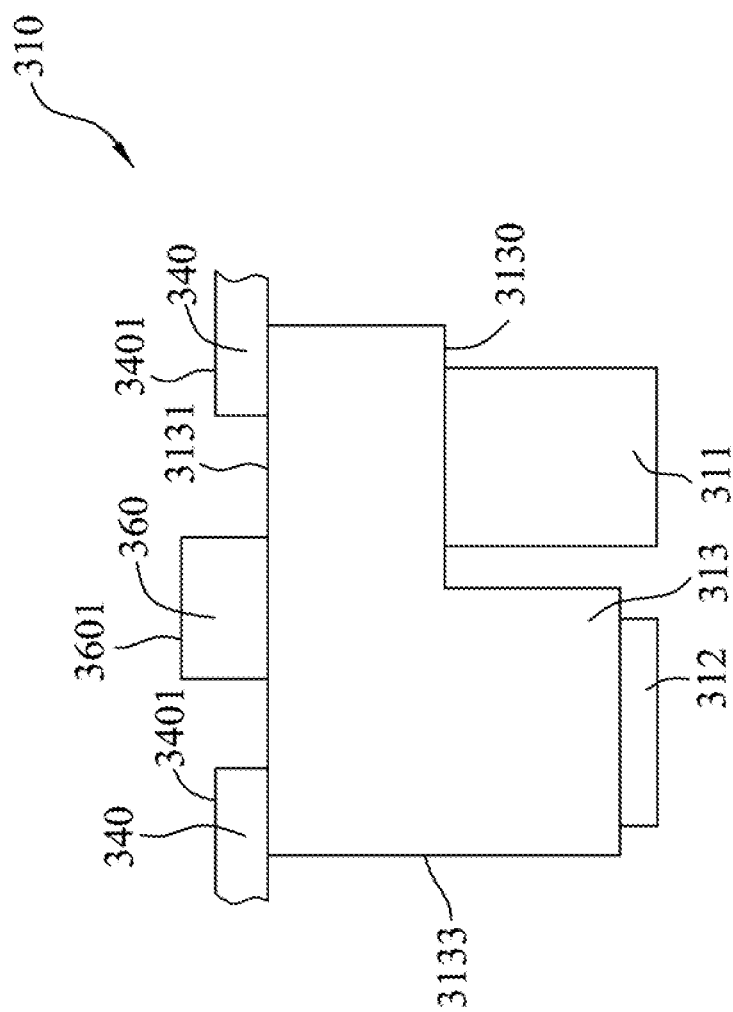
FIG. 12 is a schematic sectional view similar to FIG. 8, except that bridge connection members remain on an epitaxial semiconductor structure with a portion thereof broken.

FIGS. 8 and 12 show that the micro light-emitting element 310 in the first embodiment of the micro light-emitting device has been separated from the support structure 330 by the transfer means. After such separation, the entire bridge connection members 340 may remain on the epitaxial semiconductor structure 313 (see FIG. 8), or the bridge connection members 340 may remain on the epitaxial semiconductor structure 313 with a portion thereof broken (see FIG. 12).

Figure 9:
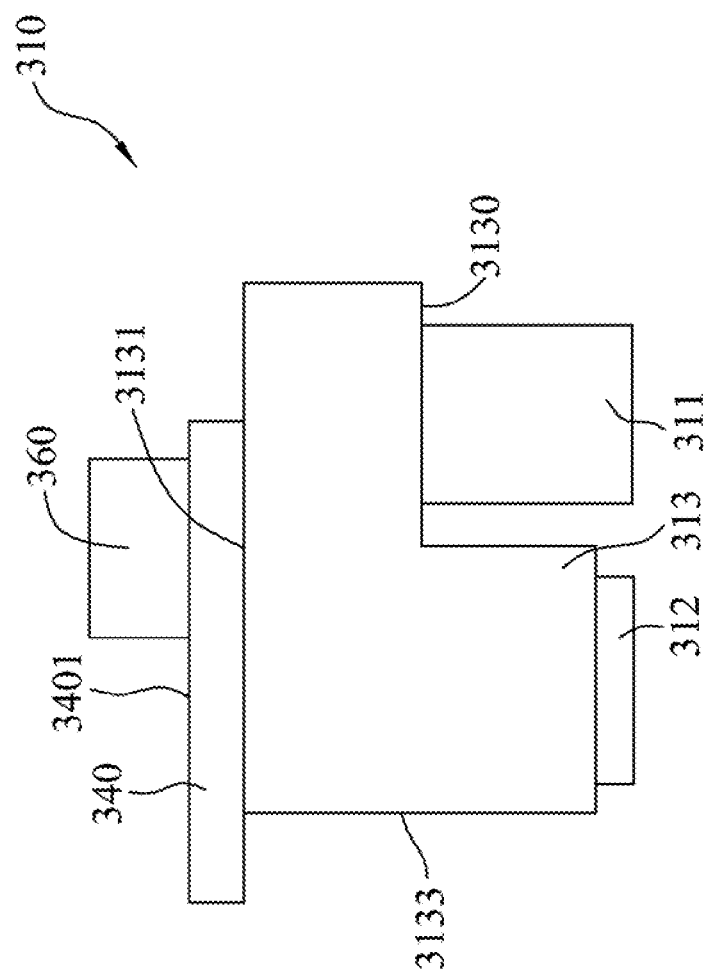
FIG. 9 is a schematic sectional view illustrating the micro light-emitting element, separated from the second embodiment of the micro light-emitting device.
Figure 13:
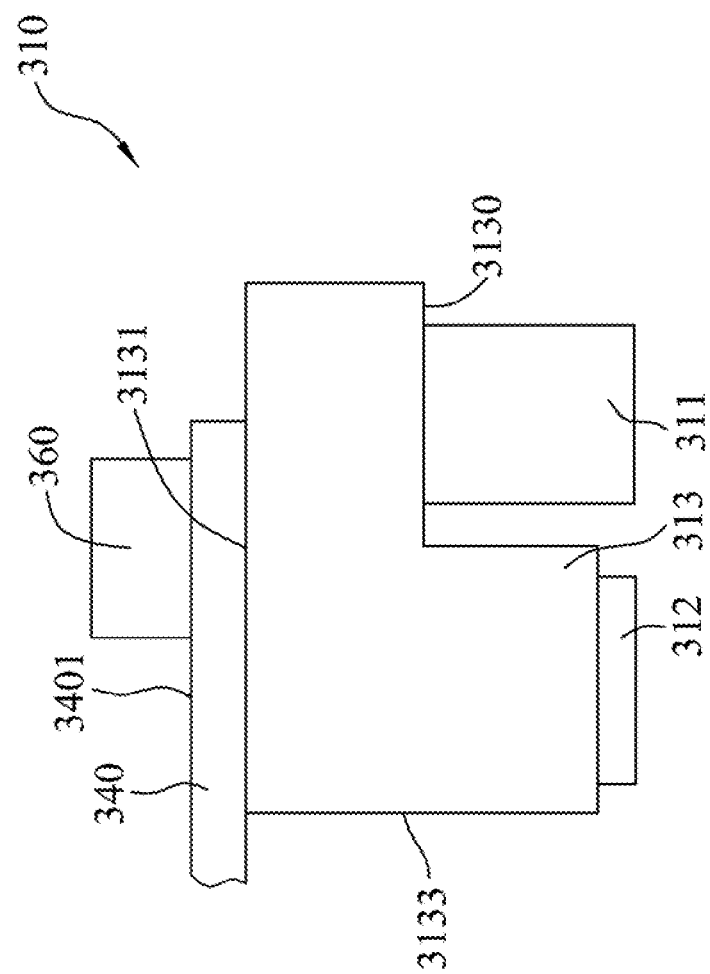
FIG. 13 is a schematic sectional view similar to FIG. 9, except that the bridge connection member remains on the epitaxial semiconductor structure with a portion thereof broken.

FIGS. 9 and 13 show that the micro light-emitting element 310 in the second embodiment of the micro light-emitting device has been separated from the support structure 330 by the transfer means. After such separation, the entire bridge connection member 340 may remain on the epitaxial semiconductor structure 313 (see FIG. 9), or the bridge connection member 340 may remain on the epitaxial semiconductor structure 313 with a portion thereof broken (see FIG. 13).

Figure 10:
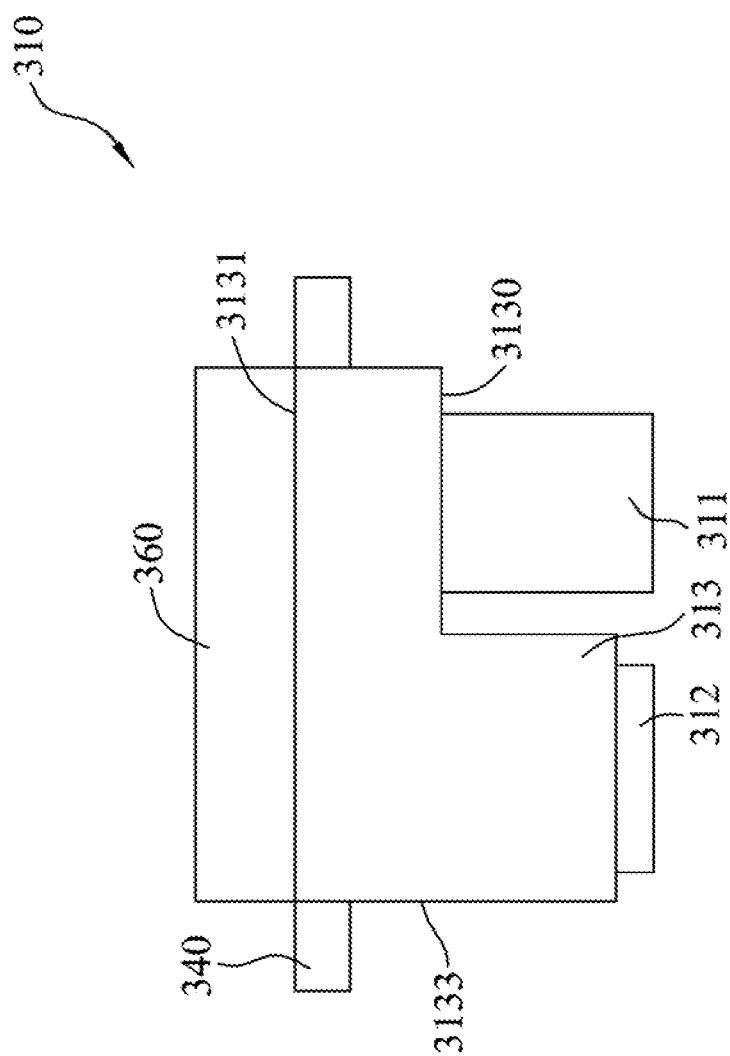
FIG. 10 is a schematic sectional view illustrating the micro light-emitting element separated from the third embodiment of the micro light-emitting device.
Figure 14:
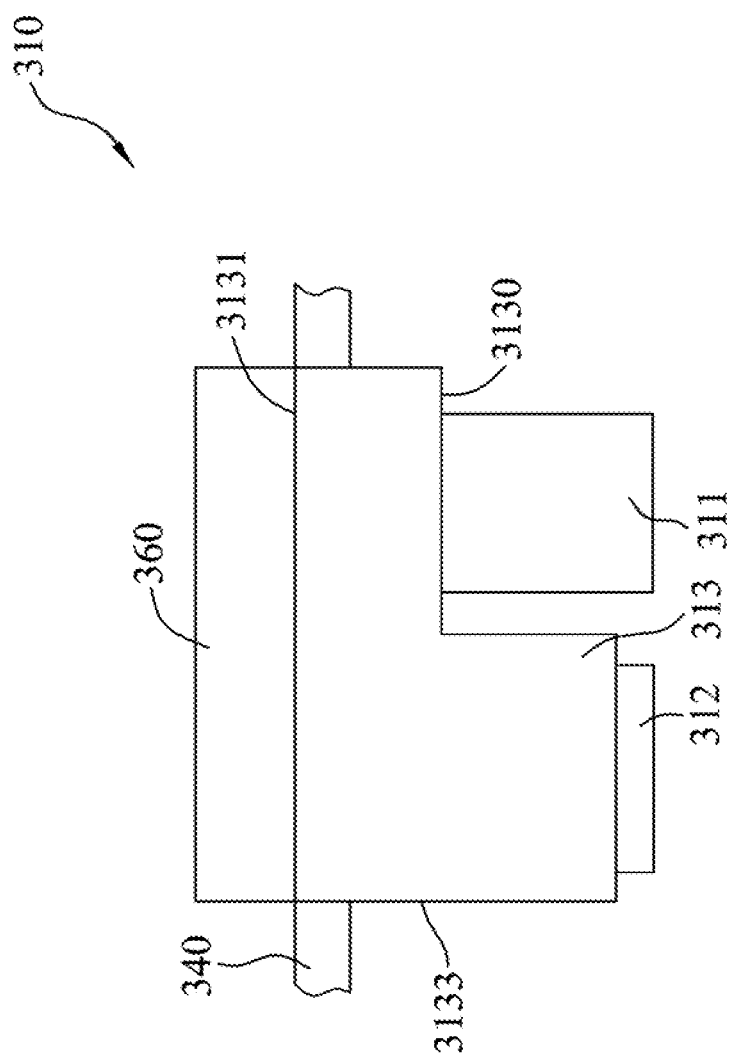
FIG. 14 is a schematic sectional view similar to FIG. 10, except that the bridge connection members remain on the epitaxial semiconductor structure with a portion thereof broken.

FIGS. 10 and 14 show that the micro light-emitting element 310 in the third embodiment of the micro light-emitting device has been separated from the support structure 330 by the transfer means. After such separation, the entire bridge connection members 340 may remain on the epitaxial semiconductor structure 313 (see FIG. 10), or the bridge connection members 340 may remain on the epitaxial semiconductor structure 313 with a portion thereof broken (see FIG. 14). In a variation of the third embodiment, the micro light-emitting device, like the first embodiment, may include a plurality of the micro light-emitting elements 310, so that after the separation from the support structure 330 by the transfer means, the micro light-emitting elements 310 may be arranged, for example, in a matrix array.

Figure 11:
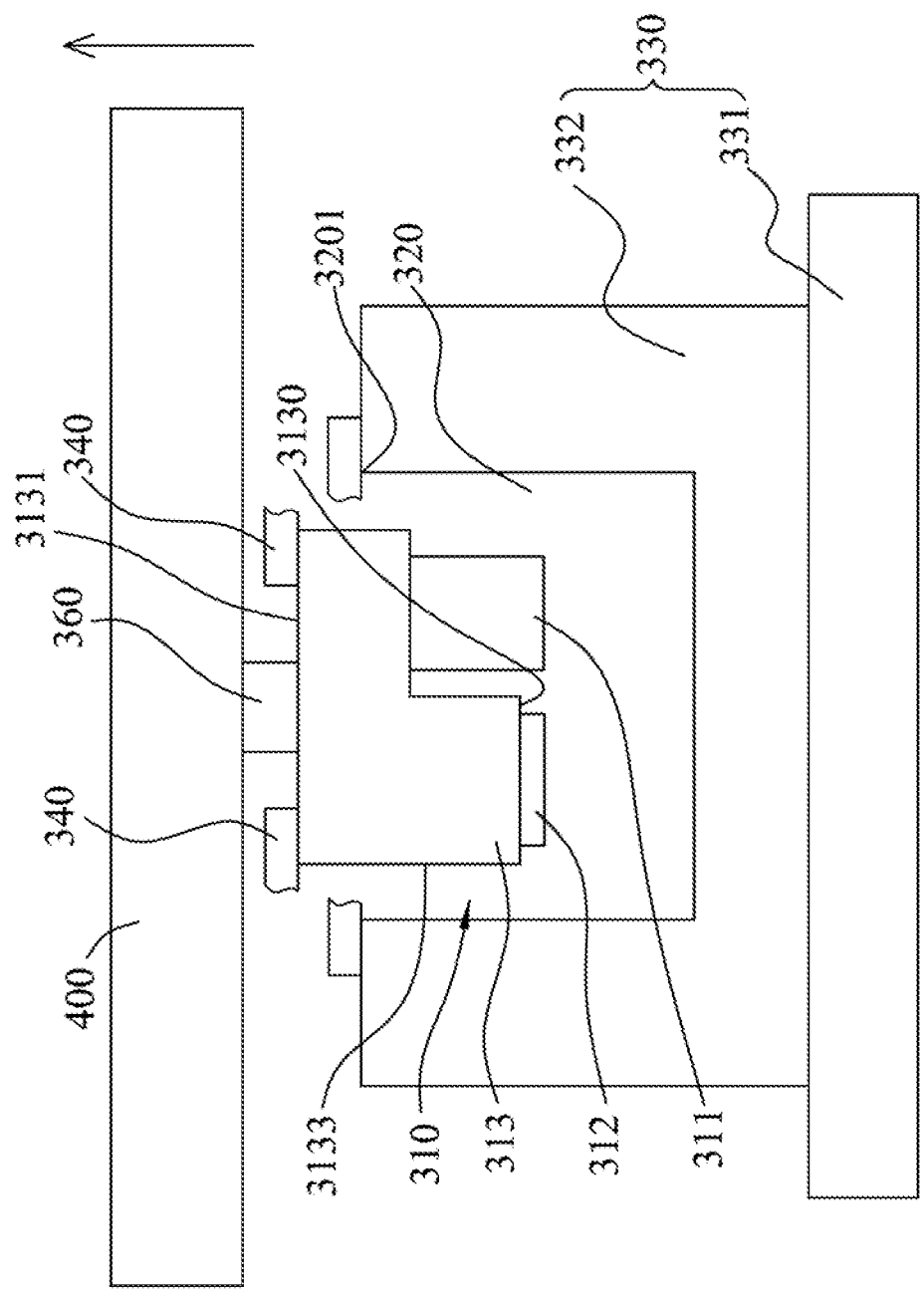
FIG. 11 is a schematic sectional view illustrating a first embodiment of a method for transferring a micro light-emitting element according to the present disclosure.

Referring to FIG. 11, a first, embodiment of a method for transferring a micro light-emitting element according to the present disclosure is provided. The method includes steps 1 to 3.

In step 1, the first embodiment of the micro light-emitting device and the transfer stamp 400 are provided.

In step 2, the transfer stamp 400 is brought into contact with the protruding contact member 360, and a pressing force is applied to the protruding contact member 360 via the transfer stamp 400, so that the micro light-emitting element 310 is separated from the support structure 330 for the transfer means 400 to transfer the micro light-emitting element 310. The separation of the micro light-emitting element 310 from the support structure 330 may be attributed to the following: breakage of the bridge connection members 340 (as shown in FIGS. 11 and 12); detachment of the bridge connection members 340 from the support structure 330 (as shown in FIG. 8); detachment of the epitaxial semiconductor structure 313 from the bridge connection members 340 (not shown), breakage of parts of the epitaxial semiconductor structure 313 which are connected to the bridge connection members 340 (not shown); or combinations thereof.

In step 3, by virtue of the van der Waals force, clamping force, and/or adsorption force between the protruding contact member 360 and the transfer stamp 400, the micro light-emitting element 310 is transferred to a desired place (e.g. a packing substrate) using the transfer stamp 400.

Referring back to FIG. 7, a second embodiment of the method for transferring a micro light-emitting element according to the present disclosure is generally similar to the first embodiment of the method, except for the following differences.

The fourth embodiment of the micro light-emitting device is provided in step 1 and is subjected to the rest of the steps of the transfer method. Since the protruding contact members 360 in the fourth embodiment of the micro light-emitting device are different in height, the second embodiment of the transfer method employing such protruding contact members 360 can be used to selectively transfer the micro light-emitting element(s) 310.

Based on the epitaxial semiconductor structures 313 thereof, the micro light-emitting elements 310 basically are blue light-emitting elements that have an emission wavelength ranging from, for instance, 400 nm to 800 nm. Such micro blue light-emitting elements 310 are divided into groups 1 to 3. The protruding contact members 360 of the micro blue light-emitting elements 310 of group 1 are made of an insulation material. The protruding contact members 360 of the micro blue light-emitting elements 310 of group 2 are made of a wavelength conversion material such as a green phosphor material capable of converting blue light (emitted from the epitaxial semiconductor structures 313) to green light, and have a height larger than that of the protruding contact members 360 of the micro blue light-emitting elements 310 of group 1. The protruding contact members 360 of the micro blue light-emitting elements 310 of group 3 are made of a wavelength conversion material such as a red phosphor material capable of converting blue light (emitted from the epitaxial semiconductor structures 313) to red light, and have a height larger than those of the protruding contact members 360 of the micro blue light-emitting elements 310 of groups 3 and 2.

The micro blue light-emitting elements 310 are selectively transferred according to the different heights of protruding contact members 360. Specifically, the micro blue light-emitting elements 310 of group 3 (having the protruding contact members 360 with the largest height) are first separated from the support structure 330 and transferred using the transfer stamp 400. Subsequently, the micro blue light-emitting elements 310 of group 2 (having the protruding contact members 360 with the intermediate height) are separated from the support structure 330 and transferred using the transfer stamp 400. Lastly, the micro blue light-emitting elements 320 of group 1 (having the protruding contact members 360 with the smallest height) are separated from the support structure 330 and transferred using the transfer stamp 400.

The advantages of the micro light-emitting element and device and the transfer method according to the present disclosure are described below.

First of all, since the micro light-emitting element 310 can be transferred by the transfer means through the protruding contact member 360 which is not liable to break during transfer, the micro light-emitting element 310 can be prevented from undesirably falling into the open cavity 320 of the bonding layer 332 of the support structure 330 during transfer even if the bridge connection member(s) 340 break due to the pressing force applied to the transfer means.

Secondly, the protruding contact member 360 may be made from a material the same as one of the materials of the epitaxial semiconductor structure 313 (for instance, the protruding contact member 360 may be integrally formed with the epitaxial semiconductor structure 313), such that the protruding contact member 360 can be prevented from undesirably absorbing light and reducing luminance.

Thirdly, the protruding contact member 360 may be made from a wavelength conversion material to satisfy the need of a display device in terms of the wavelength of emitted light.

Fourthly, since a plurality of the protruding contact members 360 may be different in height, the transfer method employing such protruding contact members 360 is a selective transfer method that can conveniently transfer desired micro light-emitting elements having the same or different specifications.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A micro light-emitting element adapted to be supported by a support structure, and adapted to contact with and be transferred by a transfer means from the support structure, the support structure having an open cavity, the micro light-emitting element comprising:
    an epitaxial semiconductor structure configured to be accommodated by the open cavity of the support structure;
    at least one bridge connection member disposed on said epitaxial semiconductor structure to be configured to interconnect said epitaxial semiconductor structure and the support structure for the support structure to support said micro light-emitting element; and
    a protruding contact member disposed on at least one of said epitaxial semiconductor structure and said bridge connection member, and protruding therefrom to be configured to contact with the transfer means, said protruding contact member extending away from said epitaxial semiconductor structure to terminate at an end that is farther away from said epitaxial semiconductor structure than said bridge connection member, so that said micro light-emitting element is configured to contact with the transfer means at said protruding contact member.

2. The micro light-emitting element as claimed in claim 1, wherein said epitaxial semiconductor structure has an upper semiconductor surface configured to face away from the open cavity of the support structure, said bridge connection member being configured to interconnect said upper semiconductor surface of said epitaxial semiconductor structure and the support structure, and having an upper bridge surface configured to face away from said open cavity of the support structure, said protruding contact member being disposed on at least one location selected from the group consisting of said upper semiconductor surface of said epitaxial semiconductor structure and said upper bridge surface of said bridge connection member.

3. The micro light-emitting element as claimed in claim 1, wherein said epitaxial semiconductor structure has an upper semiconductor surface that is configured to face away from the open cavity of the support structure, and a lateral semiconductor surface that is configured to extend downwardly from said upper semiconductor surface toward the open cavity, said bridge connection member be configured to interconnect said lateral semiconductor surface of said epitaxial semiconductor structure and the support structure, said protruding contact member of said micro light-emitting element being disposed on said upper semiconductor surface of said epitaxial semiconductor structure.

4. The micro light-emitting element as claimed in claim 1, wherein said protruding contact, member has a height in a range of 0.5 µm to 5 µm.

5. The micro light-emitting element as claimed in claim 1, wherein said protruding contact member is made from a material the same as at least one material of said epitaxial semiconductor structure.

6. The micro light-emitting element as claimed in claim 1, wherein said protruding contact, member is made from a material selected from the group consisting of an epitaxial semiconductor material, a wavelength conversion material, a transparent insulation material, a reflective material, and combinations thereof.

7. The micro light-emitting element as claimed in claim 1, wherein said protruding contact member is made from a material selected from the group consisting of an n-type semiconductor material, a light-emitting active material of multi-quantum wells, a p-type semiconductor material, silicon dioxide, silicon nitride, silicon rubber, a resin, an ultraviolet curable adhesive, titanium dioxide, and combinations thereof.

8. The micro light-emitting element as claimed in claim 1, wherein said protruding contact member is in a form selected from the group consisting of a rectangular mesa, a barrel, a circular mesa, a cylinder, and a cone.

9. The micro light-emitting element as claimed in claim 1, which is a flip-chip light-emitting element.

10. The micro light-emitting element as claimed in claim 1, which has a width in a range of 2 µm to 100 µm.

11. The micro light-emitting element as claimed in claim 1, which has a length in a range of 2 µm to 100 µm.

12. A micro light-emitting device adapted to contact with a transfer means, the micro light-emitting device comprising:
a support structure having an open cavity; and
at least one micro light-emitting element, including
an epitaxial semiconductor structure that is accommodated by said open cavity of said support structure,
at least one bridge connection member that is disposed on said epitaxial semiconductor structure to interconnect said epitaxial semiconductor structure and said support structure for said support structure to support said micro light-emitting element, and
a protruding contact member that is disposed on at least one of said epitaxial semiconductor structure and said bridge connection member, and protruding therefrom to be configured to contact with the transfer means, said protruding contact member extending away from said epitaxial semiconductor structure to terminate at an end that is farther away from said epitaxial semiconductor structure than said bridge connection member, so that said micro light-emitting device is configured to contact with the transfer means at said protruding contact member of said micro light-emitting element, and so that said micro light-emitting element is configured to be transferred by the transfer means from said support structure.

13. The micro light-emitting device as claimed in claim 12, wherein said epitaxial semiconductor structure of said micro light-emitting element has an upper semiconductor surface facing away from said open cavity of said support structure, said bridge connection member of said micro light-emitting element interconnecting said upper semiconductor surface of said epitaxial semiconductor structure and said support structure, and having an upper bridge surface that faces away from said open cavity of said support structure, said protruding contact member of said micro light-emitting element being disposed on at least one location selected from the group consisting of said upper semiconductor surface of said epitaxial semiconductor structure and said upper bridge surface of said bridge connection member.

14. The micro light-emitting device as claimed in claim 12, wherein said epitaxial semiconductor structure of said micro light-emitting element has an upper semiconductor surface that faces away from said open cavity of said support structure, and a lateral semiconductor surface that extends downwardly from said upper semiconductor surface toward said open cavity of said support structure, said bridge connection member of said micro light-emitting element interconnecting said lateral semiconductor surface of said epitaxial semiconductor structure and said support structure, said protruding contact member of said micro light-emitting element being disposed on said upper semiconductor surface of said epitaxial semiconductor structure.

15. The micro light-emitting device as claimed in claim 12, wherein said protruding contact member of said micro light-emitting element is disposed farther away from said open cavity of said support structure compared to said epitaxial semiconductor structure of said micro light-emitting element.

16. The micro light-emitting device as claimed in claim 12, wherein said protruding contact member of said micro light-emitting element has a height in a range of 0.5 µm to 5 µm.

17. The micro light-emitting device as claimed in claim 12, wherein said protruding contact member of said micro light-emitting element is made from a material the same as at least one material of said epitaxial semiconductor structure of said micro light-emitting element.

18. The micro light-emitting device as claimed in claim 12, wherein said protruding contact member of said micro light-emitting element is made from a material selected from the group consisting of an epitaxial semiconductor material, a wavelength conversion material, a transparent insulation material, a reflective material, and combinations thereof.

19. The micro light-emitting device as claimed in claim 12, wherein said protruding contact member of said micro light-emitting element is made from a material selected from the group consisting of an n-type semiconductor material, a light-emitting active material of multi-quantum wells, a p-type semiconductor material, silicon dioxide, silicon nitride, silicon rubber, a resin, an ultraviolet curable adhesive, titanium dioxide, and combinations thereof.

20. The micro light-emitting device as claimed in claim 12, comprising a plurality of said micro light-emitting elements arranged in a matrix array, said support structure having a plurality of said open cavities for respectively accommodating said epitaxial semiconductor structures of said micro light-emitting elements.

21. The micro light-emitting device as claimed in claim 12, wherein said micro light-emitting element has a width in a range of 2 µm to 100 µm.

22. The micro light-emitting device as claimed in claim 12, wherein said micro light-emitting element has a length in a range of 2 µm to 100 µm.

23. The micro light-emitting device as claimed in claim 12, wherein said support structure includes a substrate and a bonding layer that is disposed on said substrate, and that defines said open cavity, said bridge connection member of said micro light-emitting element interconnecting said epitaxial semiconductor structure of said micro light-emitting element and said bonding layer of said support structure for said bonding layer of said support structure to support said micro light-emitting element.

24. The micro light-emitting device as claimed in claim 23, wherein said bonding layer of said support structure is made from a material selected from the group consisting of a benzocyclobutene adhesive, silicon rubber, an ultraviolet curable adhesive, a resin, and combinations thereof.

25. The micro light-emitting device as claimed in claim 12, wherein said bridge connection member of said micro light-emitting element is made from a material selected from the group consisting of a dielectric material, & metallic material, a semiconductor material, and combinations thereof.

26. The micro light-emitting device as claimed in claim 12, wherein said epitaxial semiconductor structure of said micro light-emitting element has an upper semiconductor surface that faces away from said open cavity of said support structure, and a stepped lower semiconductor surface that is opposite to said upper semiconductor surface, said micro light-emitting element further including a first electrode and a second electrode that are disposed on said stepped lower semiconductor surface of said epitaxial semiconductor structure.

27. The micro light-emitting device as claimed in claim 12, wherein said micro light-emitting element is a flip-chip light-emitting element.

28. The micro light-emitting device as claimed in claim 12, comprising a plurality of said micro light-emitting elements, said protruding contact members of said micro light-emitting elements being different in height.

29. The micro light-emitting device as claimed in claim 28, wherein said micro light-emitting elements are different in a property selected from the group consisting of size, shape, emission wavelength, luminance, color temperature, and combinations thereof.

30. The micro light-emitting device as claimed in claim 12, further comprising a sacrificial layer disposed in said open cavity of said support structure and between said epitaxial semiconductor structure of said micro light-emitting element and said support structure.

31. The micro light-emitting device as claimed in claim 12, wherein said protruding contact member of said micro light-emitting element is in a form selected from the group consisting of a rectangular mesa, a barrel, a circular mesa, a cylinder, and a cone.

32. A method for transferring a micro light-emitting element, the method comprising:
 providing a micro light-emitting device as claimed in claim 12 and a transfer means, the micro light-emitting device having at least one micro light-emitting element;
 bringing the transfer means into contact with a protruding contact member of the micro light-emitting element of the micro light-emitting device; and
 applying a force to the protruding contact member of the micro light-emitting element of the micro light-emitting device via the transfer means, so as to separate the micro light-emitting element of the micro light-emitting device from a support structure of the micro light-emitting device for the transfer means to transfer the micro light-emitting element.

33. The method as claimed in claim 32, wherein the micro light-emitting device includes a plurality of the micro light-emitting elements, the protruding contact members of the micro light-emitting elements being different in height.

34. The method as claimed in claim 32, wherein the protruding contact member of the micro light-emitting element of the micro light-emitting device is disposed farther away from an open cavity of the support structure of the micro light-emitting device compared to an epitaxial semiconductor structure of the micro light-emitting element of the micro light-emitting device.

35. The method as claimed in claim 32, wherein the transfer means is a transfer stamp.

36. The method as claimed in claim 35, wherein the transfer stamp is made from a material selected from the group consisting of polydimethylsiloxane, silicon rubber, a thermal release tape, an ultraviolet curable adhesive, and combinations thereof.

37. A micro light-emitting element obtained using a method as claimed in claim 32.

* * * * *